(12) United States Patent
Evans et al.

(10) Patent No.: US 11,016,228 B2
(45) Date of Patent: *May 25, 2021

(54) SYSTEM AND METHOD FOR FORMING DIFFRACTED OPTICAL ELEMENT HAVING VARIED GRATINGS

(71) Applicant: Varian Semiconductor Equipment Associates, Inc., Gloucester, MA (US)

(72) Inventors: Morgan Evans, Manchester, MA (US); Rutger Meyer Timmerman Thijssen, Sunnyvale, CA (US); Joseph Olson, Beverly, MA (US); Peter Kurunczi, Cambridge, MA (US); Robert Masci, Atkinson, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/785,612

(22) Filed: Feb. 9, 2020

(65) Prior Publication Data

US 2020/0233125 A1 Jul. 23, 2020

Related U.S. Application Data

(63) Continuation of application No. 15/865,943, filed on Jan. 9, 2018, now Pat. No. 10,598,832.

(51) Int. Cl.
*G02B 5/18* (2006.01)
*G02B 6/136* (2006.01)
(Continued)

(52) U.S. Cl.
CPC ......... *G02B 5/1828* (2013.01); *G02B 5/1814* (2013.01); *G02B 5/1857* (2013.01); *G11B 7/1353* (2013.01); *G11B 7/1372* (2013.01)

(58) Field of Classification Search
None
See application file for complete search history.

(56) References Cited

U.S. PATENT DOCUMENTS 4,119,881 A * 10/1978 Calderon ............. H01J 27/022
204/192.34
7,039,285 B2 5/2006 Hamada
(Continued)

FOREIGN PATENT DOCUMENTS

JP 06201909 A 7/1994
WO 2016020643 A1 2/2016

OTHER PUBLICATIONS

International Search Report and Written Opinion dated Apr. 23, 2019 from PCT/US2019/012188 filed Jan. 3, 2019, 6 pages.

*Primary Examiner* — Shamim Ahmed
(74) *Attorney, Agent, or Firm* — Kacvinsky Daisak Bluni PLLC

(57) ABSTRACT

Embodiments herein provide systems and methods for forming an optical component. A method may include providing a plurality of proximity masks between a plasma source and a workpiece, the workpiece including a plurality of substrates secured thereto. Each of the plurality of substrates may include first and second target areas. The method may further include delivering, from the plasma source, an angled ion beam towards the workpiece, wherein the angled ion beam is then received at one of the plurality of masks. A first proximity mask may include a first set of openings permitting the angled ion beam to pass therethrough to just the first target area of each of the plurality of substrates. A second proximity mask may include a second set of openings permitting the angled ion beam to pass therethrough just to the second target area of each of the plurality of substrates.

20 Claims, 10 Drawing Sheets

(51) Int. Cl.
*G11B 7/1372* (2012.01)
*G11B 7/1353* (2012.01)

(56) References Cited

U.S. PATENT DOCUMENTS

| | | |
|---|---|---|
| 8,765,583 B2 | 7/2014 | Riordon et al. |
| 9,128,226 B2 | 9/2015 | Fattal et al. |
| 9,389,415 B2 | 7/2016 | Fattal et al. |
| 9,513,480 B2 | 12/2016 | Saarikko et al. |
| 9,536,748 B2 * | 1/2017 | Berry, III .......... H01J 37/32422 |
| 9,722,129 B2 | 8/2017 | Bateman et al. |
| 2005/0130072 A1 | 6/2005 | Koeda |
| 2006/0146408 A1 | 7/2006 | Ushiro et al. |
| 2010/0018858 A1 | 1/2010 | Seki |
| 2014/0353141 A1 | 12/2014 | Liu et al. |
| 2016/0033784 A1 | 2/2016 | Levola et al. |
| 2016/0035539 A1 | 2/2016 | Sainiemi et al. |
| 2016/0259098 A1 | 9/2016 | Sasai |
| 2017/0220865 A1 | 8/2017 | Osterhout et al. |

\* cited by examiner

SYSTEM AND METHOD FOR FORMING DIFFRACTED OPTICAL ELEMENT HAVING VARIED GRATINGS

CROSS-REFERENCE TO RELATED APPLICATIONS

This is a continuation of U.S. non-provisional patent number 10,598,832, filed Jan. 9, 2018, the entire contents of the application incorporated by reference herein.

FIELD

This disclosure relates to optical elements, and more particularly to approaches for forming a diffracted optical element having varied gratings.

BACKGROUND

Optical lenses have long been used to manipulate light for various advantages. Fresnel lenses, for example, are used in lighthouses to bend light from all angles of a point light source into a beam or beams. Fresnel lenses are one particular type of blazed grating. More recently, micro-diffraction gratings have been utilized in holographic and augmented/virtual reality (AR & VR) devices.

One particular AR & VR device is a wearable display system, such as a headset or head mounted display operable to display an image within a short distance from a human eye. The image can be a computer generated image on a display, such as a micro display. The optical components are arranged to transport light of the desired image, generated on the display to the user's eye to make the image visible to the user. The image generated can form part of a light engine, wherein the image itself generates collimated light beams guided by the optical component to provide an image visible to the user.

Different kinds of optical components have been used to convey the image from the display to the human eye. These optical components include lenses, mirrors, optical waveguides, holograms and diffraction gratings, or slanted gratings. Slanted gratings are one particular type of blazed gratings, and may be used for AR & VR systems, such as wearable display systems, displays on mobile devices, etc., wherein the functional design relies on efficient light input and/or output coupling from the grating to the viewer's field of view.

While the manufacture of binary gratings with vertical walls is known, existing techniques for producing slanted gratings fail to achieve adequate grating uniformity, fin shaping, and angle control. Therefore, with respect to these and other drawbacks the present disclosure is provided.

BRIEF SUMMARY

A system for generating angled gratings according to embodiments of the present disclosure may include a system for generating angled gratings. The system may include a plasma source delivering an angled ion beam to a workpiece, and a plurality of substrates coupled to the workpiece, each of the plurality of substrates including a first angled grating and a second angled grating. The system may further include a plurality of proximity masks positionable between the plasma source and the workpiece, wherein a first proximity mask of the plurality of proximity masks includes a first set of openings permitting the angled ion beam to pass therethrough to form the first angled gratings of each of the plurality of substrates. A second proximity mask of the plurality of proximity masks may include a second set of openings permitting the angled ion beam to pass therethrough to form the second angled gratings of each of the plurality of substrates.

A method for forming an optical element according to embodiments of the disclosure may include providing a plurality of proximity masks between a plasma source and a workpiece, the workpiece including a plurality of substrates secured thereto, wherein each of the plurality of substrates includes a first target area and a second target area. The method may further include delivering, from the plasma source, an angled ion beam towards the workpiece, and receiving the angled ion beam at one of the plurality of masks. A first proximity mask of the plurality of proximity masks may include a first set of openings permitting the angled ion beam to pass therethrough to the first target area of each of the plurality of substrates. A second proximity mask of the plurality of proximity masks may include a second set of openings permitting the angled ion beam to pass therethrough to the second target area of each of the plurality of substrates.

A method for forming a diffracted optical element having varied gratings according to embodiments of the disclosure may include providing a plurality of proximity masks positionable between a plasma source and a workpiece. The workpiece may include a plurality of substrates secured thereto, wherein each of the plurality of substrates includes a first target area and a second target area. The method may include delivering, from the plasma source, an angled ion beam towards the workpiece. The method may include receiving the angled ion beam at one of the plurality of masks, wherein a first proximity mask of the plurality of proximity masks includes a first set of openings permitting the angled ion beam to pass therethrough to just the first target area of each of the plurality of substrates. A second proximity mask of the plurality of proximity masks may include a second set of openings permitting the angled ion beam to pass therethrough to just the second target area of each of the plurality of substrates. A third proximity mask of the plurality of proximity masks may include a third set of openings permitting the angled ion beam to pass therethrough to just a third target area of each of the plurality of substrates.

BRIEF DESCRIPTION OF THE DRAWINGS

The accompanying drawings illustrate exemplary approaches of the disclosure, including the practical application of the principles thereof, as follows.

Figure 1:
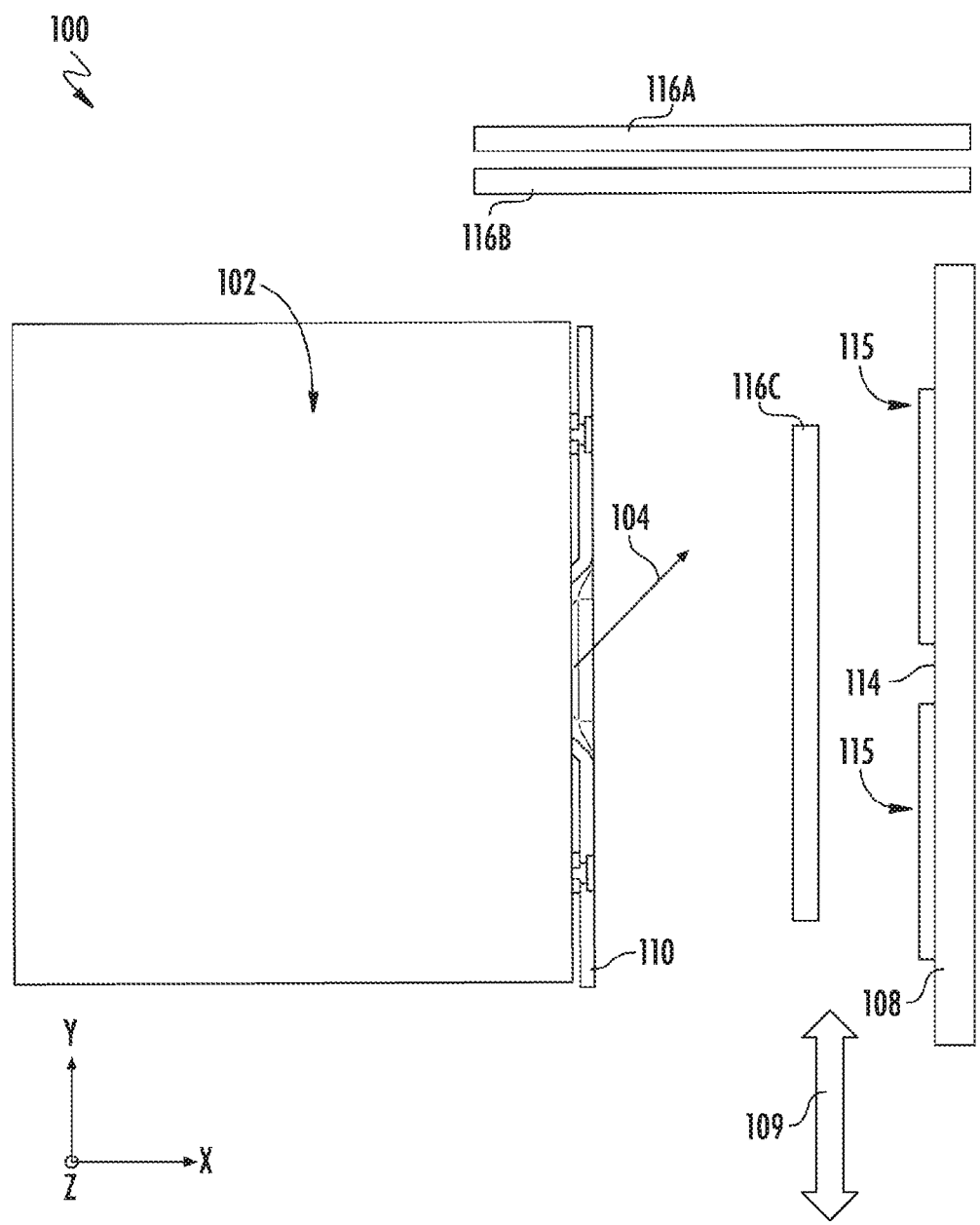
FIG. 1 depicts a system for generating angled gratings on optical components according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, references to "one embodiment" or "some embodiments" of the present disclosure may be interpreted as including the existence of additional embodiments also incorporating the recited features.

Embodiments herein provide systems and methods for forming an optical component having varied gratings. A method may include providing a plurality of proximity masks between a plasma source and a workpiece, the workpiece including a plurality of substrates secured thereto. Each of the plurality of substrates may include first and second target areas. The method may further include delivering, from the plasma source, an angled ion beam towards the workpiece, wherein the angled ion beam is then received at one of the plurality of masks. A first proximity mask may include a first set of openings permitting the angled ion beam to pass therethrough to just the first target area of each of the plurality of substrates, and a second proximity mask may include a second set of openings permitting the angled ion beam to pass therethrough just to the second target area of each of the plurality of substrates.

FIG. 1 shows part of a system 100 for generating angled gratings on optical components, such as a backlit substrate. As shown, the system 100 may include a plasma source 102 for delivering an angled ion beam (hereinafter "beam") 104, including reactive radicals, to a workpiece 108 over a wafer scan direction 109. Although not shown, the workpiece 108 may be coupled to a tool capable of moving the workpiece between load/unload positions, and to rotate the workpiece 108. In some embodiments, the plasma source 102 may be an inductively coupled plasma (ICP) reactor operable to form plasmas by inducing current in a process gas disposed within a process chamber via one or more inductive coils (not shown) disposed outside of the process chamber. The inductive coils are typically disposed above the chamber and connected to a radio frequency (RF) power source. The plasma source 102 may be at bias potential, while an exit aperture plate 110 may be at wafer potential (ground). Aperture slots (not shown) of the exit aperture plate 110 may be oriented at 45 degrees relative to a first surface 114 of the workpiece 108. In alternative embodiments, workpiece may be angled relative to a straight-projecting ion beam 104.

As shown, the system 100 may further include a plurality of substrates 115 coupled to the workpiece 108. Each of the plurality of substrates 115 may including a plurality of varied gratings, as will be described in greater detail below. To form each of the plurality of varied gratings, the system 100 may include a plurality of proximity masks 116A-C positionable between the plasma source 102 and the workpiece 108. Although not shown, each of the plurality of masks 116A-C may be coupled to any type of device operable to individually move each mask in and out of position between the ion source 102 and the plurality of substrates 115. In exemplary embodiments, just one of the plurality of masks 116A-C will be impacted by the beam 104 at a given time.

Figure 2:
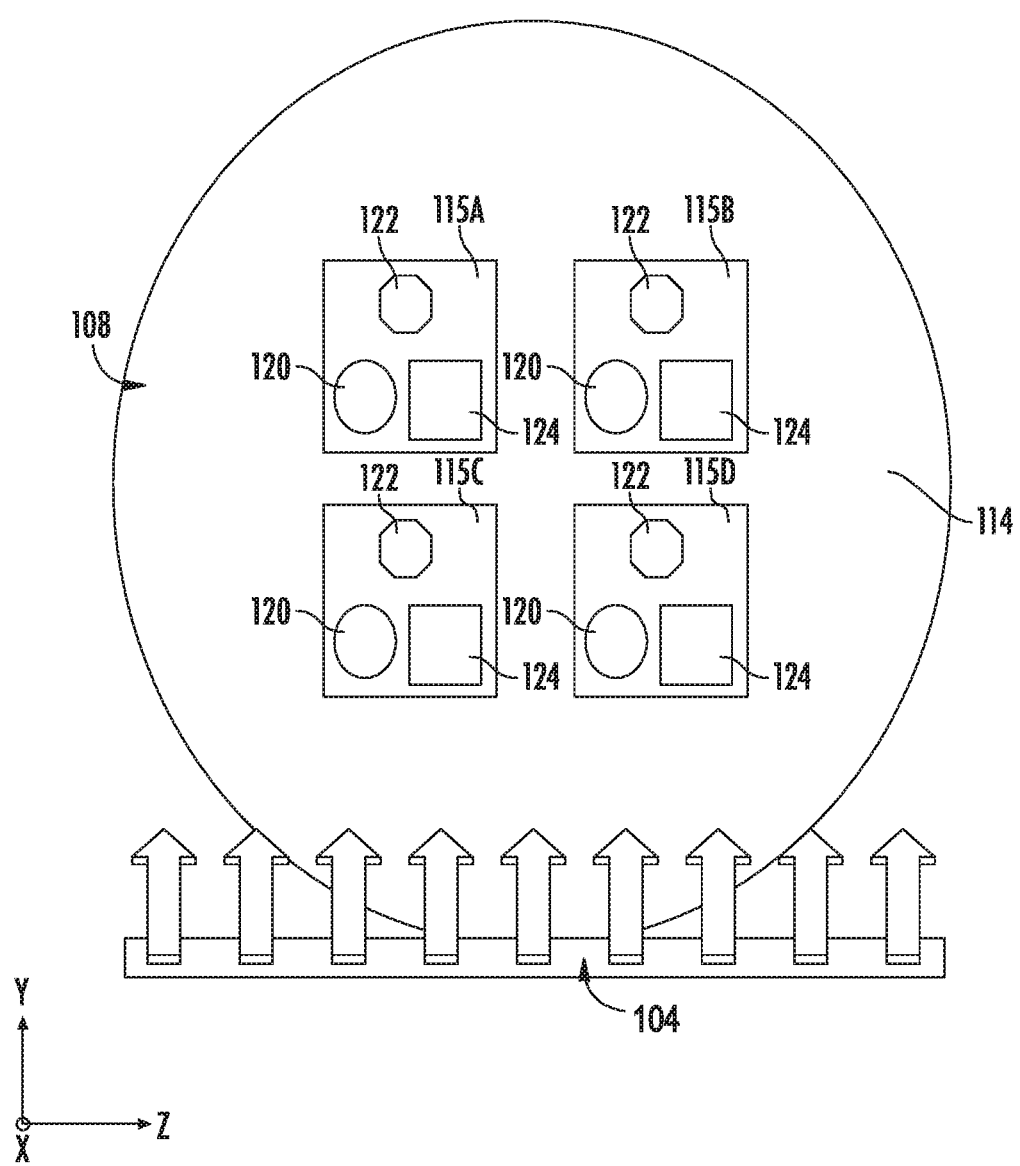
FIG. 2 depicts a plurality of substrates coupled to a workpiece of the system of FIG. 1 according to embodiments of the present disclosure.

FIG. 2 further demonstrates the workpiece 108, and the plurality of substrates 115A-D secured thereto along the first surface 114. Although four (4) substrates are shown for ease of explanation, a greater number of substrates is possible within the scope of the present disclosure. As shown, each of the plurality of substrates includes a plurality of target areas, such as a first target area 120, a second target area 122, and a third target area 124. As used herein, a "target area" refers to a portion or area of each substrate 115A-D where a varied grating parameter is desired after treatment by the beam 104. In some embodiments, the beam 104 may be a ribbon beam. As shown, a beam width of the beam 104 along the Z-axis may be greater than the diameter of the workpiece 108 along the Z-axis, as illustrated. For example, the width of the beam 104 may be a few cm wider than the workpiece 108 so the workpiece 108 is processed in one pass.

Figure 3:
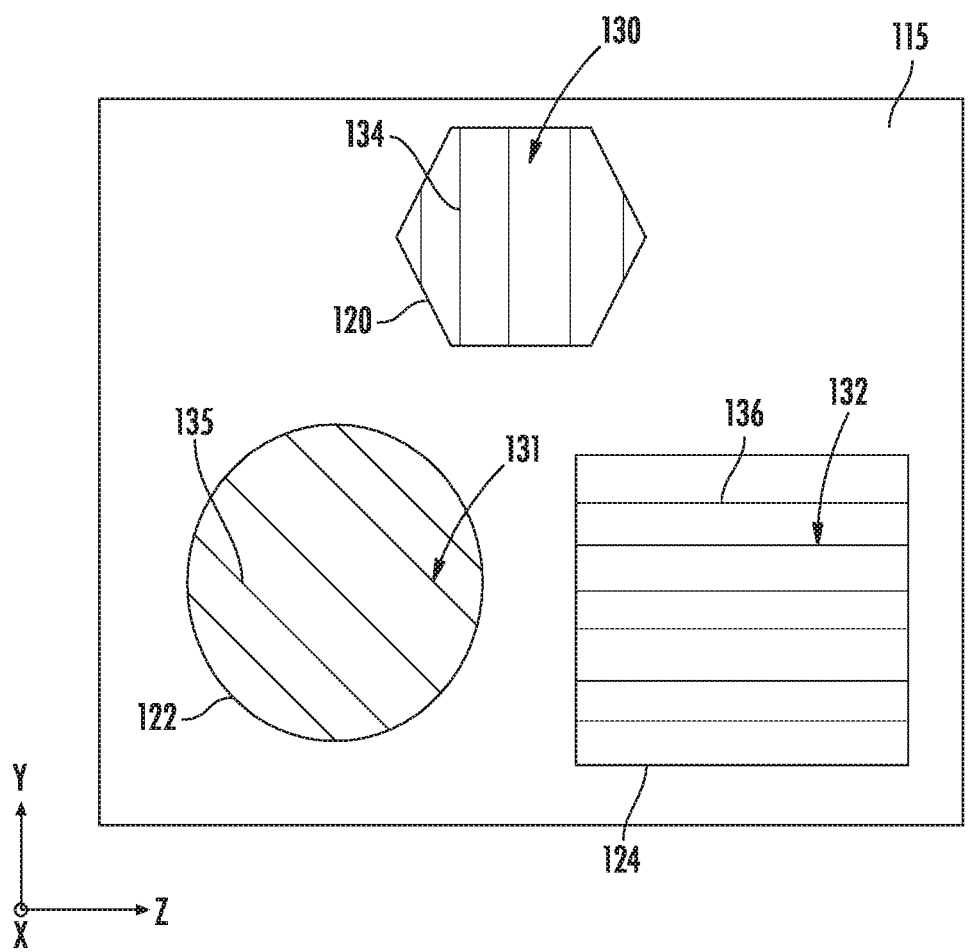
FIG. 3 depicts an example of a substrate of the system of FIG. 1 according to embodiments of the present disclosure.

FIG. 3 shows an exemplary substrate 115 according to embodiments of the disclosure in greater detail. The substrate 115 may be the same or similar to each of the plurality of substrates 115A-D shown in FIG. 2. As illustrated, the substrate 115 may include the first target area 120, the second target area 122, and the third target area 124. After a series of angled etch processes, as will be described below in further detail, a first angled grating 130 may be formed in the first target area 120. Furthermore, a second angled grating 131 may be formed in the second target area 122, and a third angled grating 132 may be formed in the third target area 124. In some embodiments, the first angled grating 130 may include a first plurality of fins 134, the second angled grating 131 may include a second plurality of fins 135, and the third angled grating 132 may include a third plurality of fins 136. Although non-limiting, the first plurality of fins 134 may be oriented parallel to the Y-axis, the second plurality of fins 135 may be oriented at an angle, e.g., 45 degrees, relative to the Z-axis, and the third plurality of fins 136 may be oriented parallel to the Z-axis. As shown, the first angled grating 130, the second angled grating 131, and the third angled grating 132 may be separated by one or more uniform or untreated portions 138 of the substrate 115. Furthermore, one will appreciate more than three sections of angled grating may be possible in other embodiments.

Figure 4:
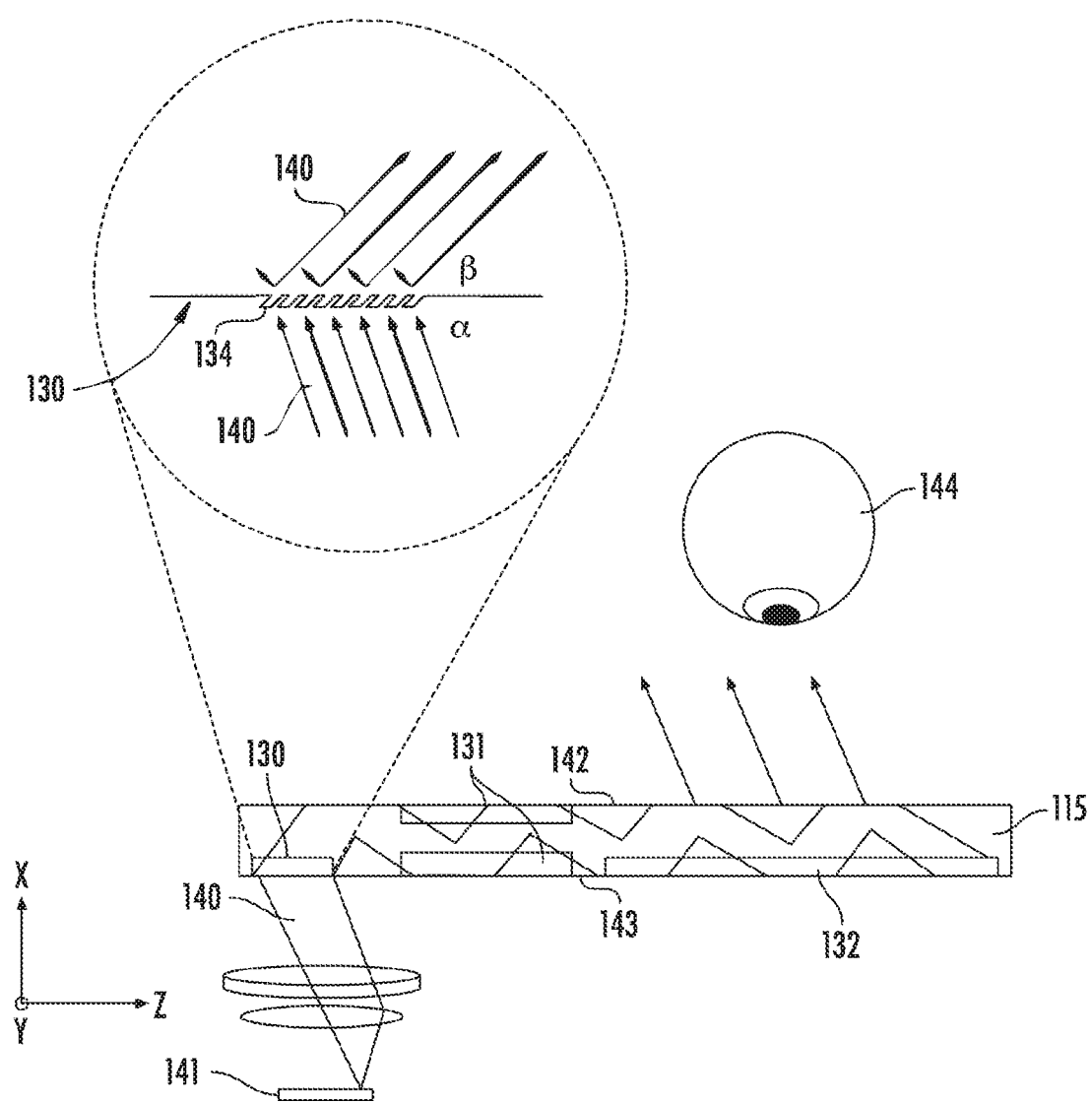
FIG. 4 depicts an example of a substrate of the system of FIG. 1 according to embodiments of the present disclosure.

FIG. 4 shows the substrate 115 with greater clarity, including an expanded version showing how a light beam 140 may interact therewith. In this embodiment, a source display 141 may provide beams of collimated light, one of the beams of collimated light being shown as the light beam 140. The light beam 140 is reflected within the substrate 115, between a first surface 142 and a second surface 143. The first angled grating 130 directs the light beam 140 towards the second angled grating 131, and the second angled grating 131 directs the light beam 140 towards the third angled grating 132. As shown, the first plurality of fins 134 of the first angled grating 130 is configured to receive the light beam 140 at a first angle α and then deliver the light beam 140 therefrom at a second angle β. In some embodiments, the third angled grating 132 may be an exit grating, causing diffraction of an image corresponding to the light beam 140 onto a user's eye 144.

Figure 5:
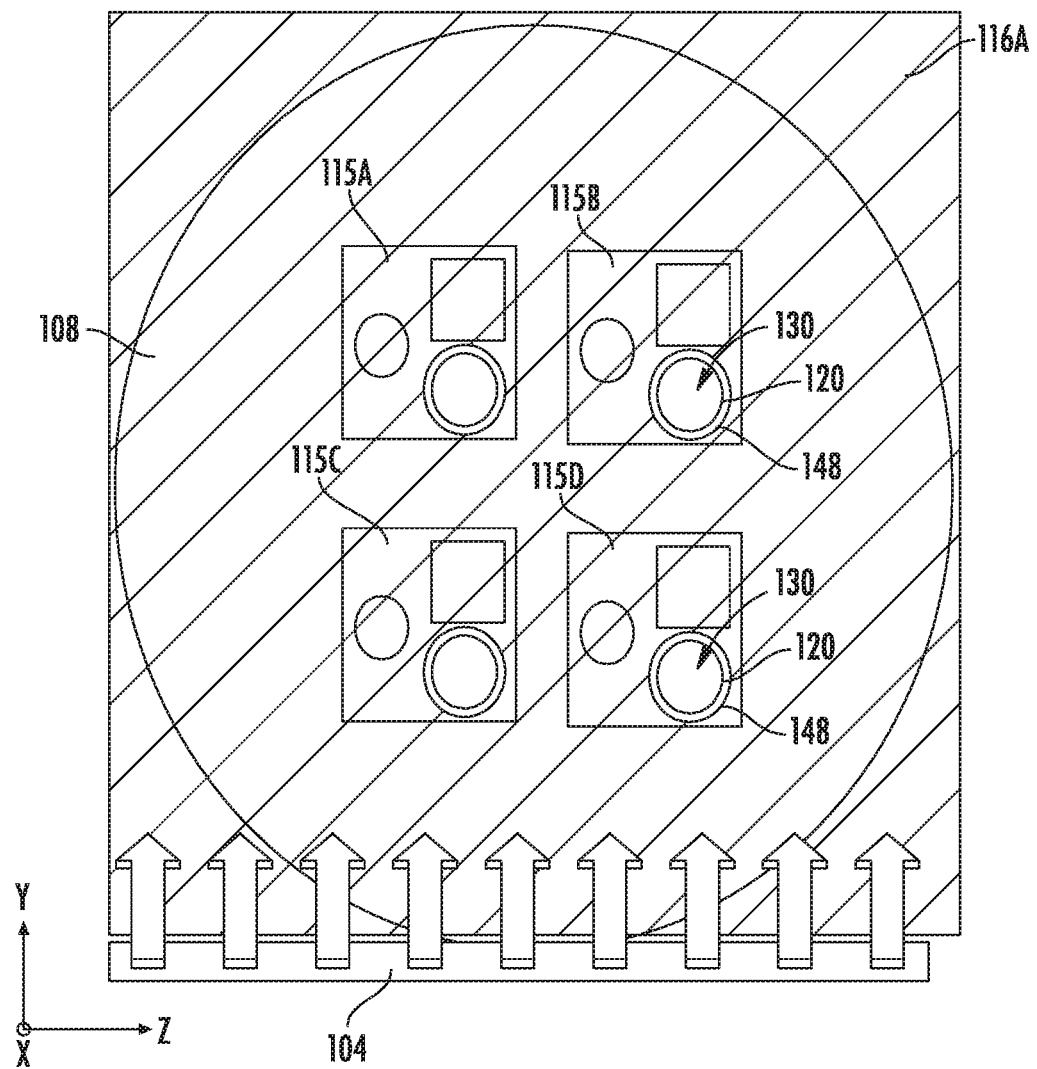
FIG. 5 depicts a first proximity mask disposed over a wafer of the system of FIG. 1 according to embodiments of the present disclosure.

FIG. 5 shows the first proximity mask 116A provided over the workpiece 108 for formation of the first angled gratings 130 for each of the plurality of substrates 115A-D. The first proximity mask 116A may include a first set of openings 148 permitting the beam 104 to pass therethrough just to each first target area 120. In exemplary embodiments, each of the first set of openings 148 is the same shape/size. The first proximity mask 116A prevents the beam 104 from reaching and impacting all other areas of the substrates 115A-D. In some embodiments, the beam 104 is provided to the plurality of substrates 115A-D as part of a first process to form the first angled gratings 130 of each of the plurality of substrates 115A-D in the first target area 120. In some embodiments, the first process may be an implant or etch process including rotating the first proximity mask 116A and the workpiece 108 relative to one another. For example, the first target area 120 may be etched by the beam 104 following a series of 90-degree rotations of the first proximity mask 116A or the workpiece 108. A fewer or greater number of rotations is possible within the scope of the present disclosure.

In one example plasma etching process, a plasma of the beam 104 may be formed adjacent the substrates 115A-D. Reactive ions and radicals from the plasma react with the surface of the substrates 115A-D, removing material therefrom. The rate of material removal, or etching, at a location on the substrates 115A-D is generally proportional to the density of reactive species adjacent the location. This process can be repeated multiple times as the first proximity mask 116A or the workpiece 108 is rotated to enable fin formation from all sides.

Figure 6:
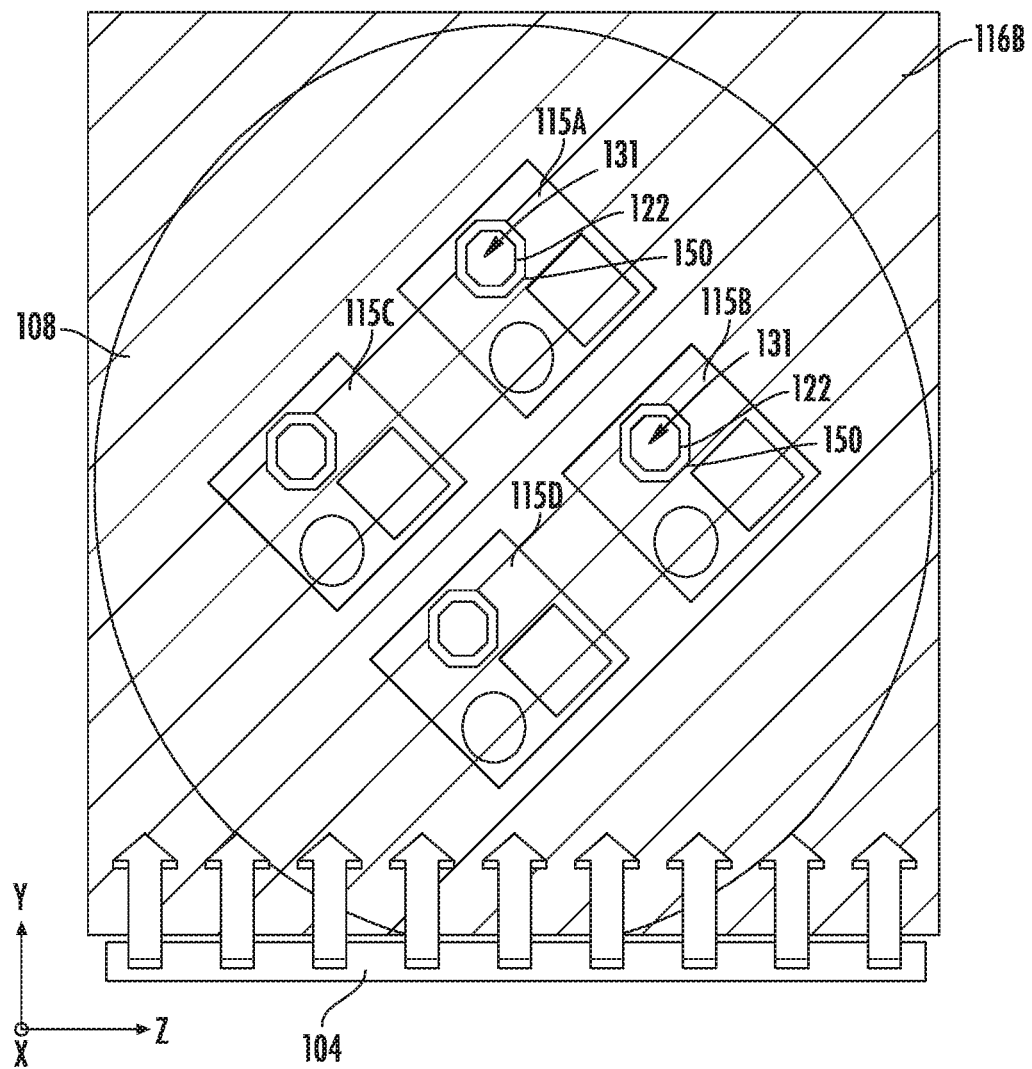
FIG. 6 depicts a second proximity mask disposed over the wafer of the system of FIG. 1 according to embodiments of the present disclosure.

FIG. 6 shows the second proximity mask 116B provided over the workpiece 108 for formation of the second angled gratings 131 for each of the plurality of substrates 115A-D. The second proximity mask 116B may include a second set of openings 150 permitting the beam 104 to pass therethrough just to each second target area 122. In exemplary embodiments, each of the second set of openings 150 is the same shape/size. The second proximity mask 116B prevents the beam 104 from reaching and impacting all other areas of the substrates 115A-D. The beam 104 may be provided to the plurality of substrates 115A-D as part of a second process to form the second angled gratings 131 of each of the plurality of substrates 115A-D in the second target area 122. In some embodiments, the second process may be an ion implant or etch including rotating the second proximity mask 116B and the workpiece 108 relative to one another. For example, the second target area 122 may be etched by the beam 104 following a series of 90-degree rotations of the second proximity mask 116B or the workpiece 108. A fewer or greater number of rotations is possible within the scope of the present disclosure.

Figure 7:
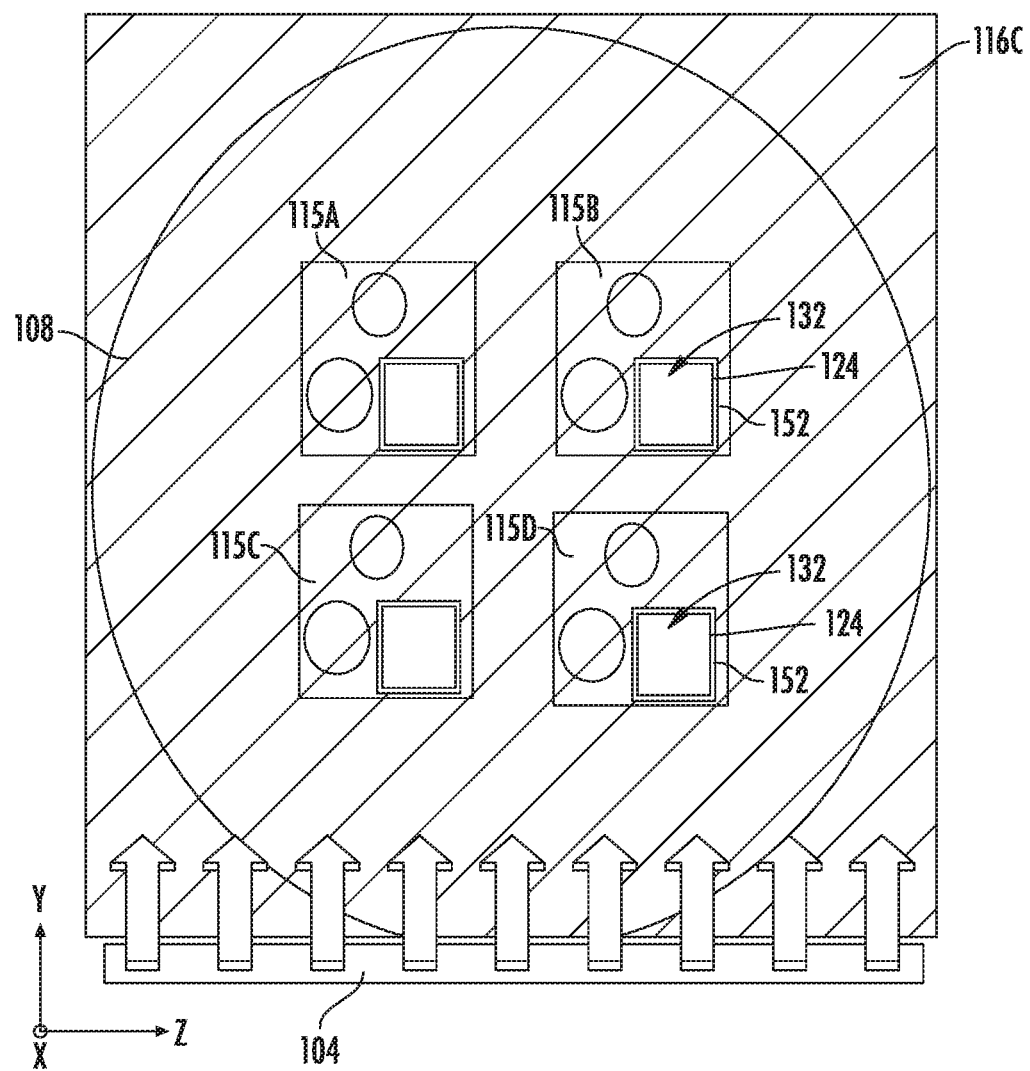
FIG. 7 depicts a third proximity mask disposed over the wafer of FIG. 1 according to embodiments of the present disclosure.

FIG. 7 shows the third proximity mask 116C provided over the workpiece 108 for formation of the third angled gratings 132 for each of the plurality of substrates 115A-D. The third proximity mask 116C may include a third set of openings 152 permitting the beam 104 to pass therethrough just to each third target area 124. In exemplary embodiments, each of the third set of openings 152 is the same shape/size. The third proximity mask 116C prevents the beam 104 from reaching and impacting all other areas of the substrates 115A-D. The beam 104 may be provided to the plurality of substrates 115A-D as part of a third process to form the third angled gratings 132 of each of the plurality of substrates 115A-D in the third target area 124. In some embodiments, the third process may be an ion implant or etch including rotating the third proximity mask 116C and the workpiece 108 relative to one another. For example, the third target area 124 may be etched by the beam 104 following a series of 90-degree rotations of the third proximity mask 116C or the workpiece 108. A fewer or greater number of rotations is possible within the scope of the present disclosure.

Figure 8A:
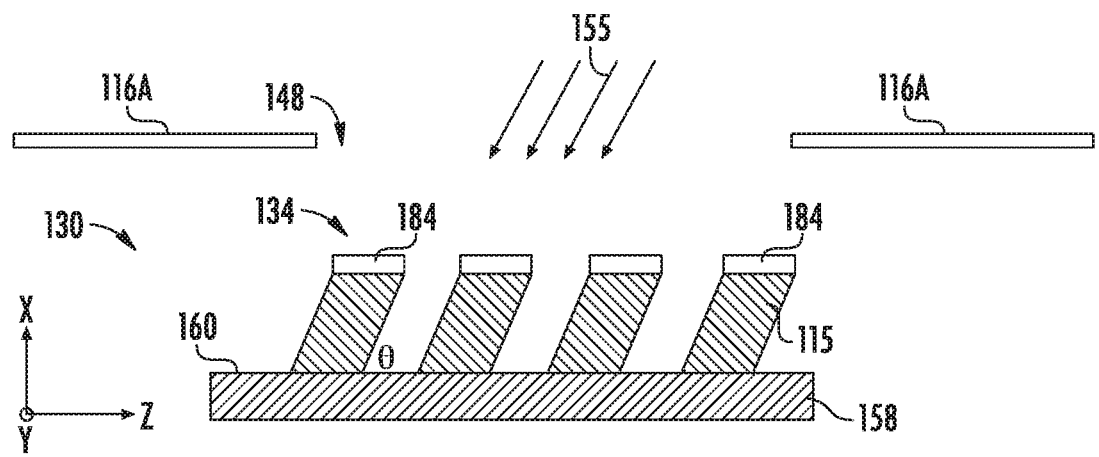
FIGS. 8A-8C depict various slanted grating structures according to embodiments of the present disclosure.
Figure 8B:
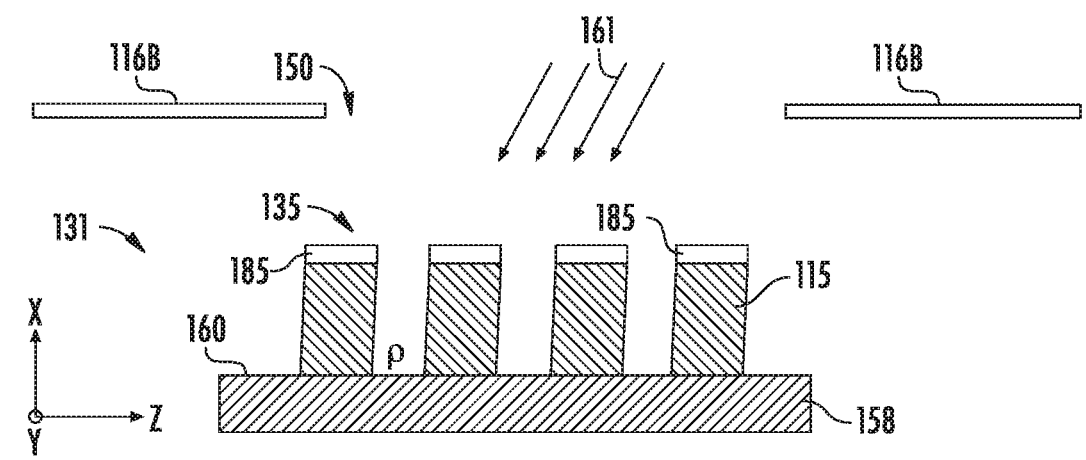
Figure 8C:
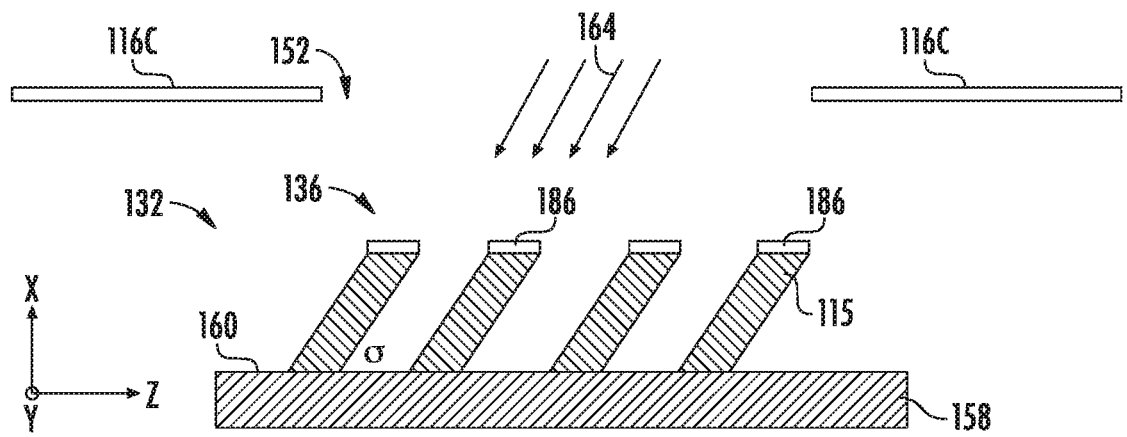

FIGS. 8A-8C show examples of various angled gratings capable of being formed according to embodiments herein. FIG. 8A may represent the first angled grating 130 including the first plurality of fins 134. As shown, the first plurality of fins 134 may be formed from the substrate 115 using the first etch process, shown as a plurality of angled plasma etch cycles 155 through the first set of openings 148 of the first proximity mask 116A. As shown, the first etch process may be performed with a first hardmask 184 formed atop each of the first plurality of fins 134. Each of the angled plasma etch cycles 155 may be performed after a rotation of the substrate 115. The first etch process may recess the substrate 115 to an etch stop layer 158. In some embodiments, the etch stop layer 158 may be a silicon based compound such as silicon nitride, silicon oxide, silicon oxynitride or silicon oxyfluoride. In other embodiments, the etch stop layer 158 may be titanium nitride. Embodiments herein are not limited to any particular material. As shown, the first etch process forms the first plurality of fins 134 having a first angle θ relative to a base surface 160 of the etch stop layer 158. In some embodiments, the first angle θ is an acute angle.

FIG. 8B may represent the second angled grating 131 including the second plurality of fins 135. As shown, the second plurality of fins 135 may be formed from the substrate 115 using the second etch process, shown as a plurality of angled plasma etch cycles 161 through the second set of openings 150 of the second proximity mask 116B. As shown, the second etch process may be performed with a second hardmask 185 formed atop each of the second plurality of fins 135. Each of the angled plasma etch cycles 161 may be performed after a rotation of the substrate 115. The second etch process may recess the substrate 115 to the etch stop layer 158. As shown, the second etch process forms the second plurality of fins 135 having a second angle ρ relative to the base surface 160 of the etch stop layer 158. In some embodiments, the second angle ρ is an acute angle.

FIG. 8C may represent the third angled grating 132 including the third plurality of fins 136. As shown, the third plurality of fins 136 may be formed from the substrate 115 using the third etch process, shown as a plurality of angled plasma etch cycles 164 through the third set of openings 152 of the third proximity mask 116C. As shown, the third etch process may be performed with a third hardmask 186 formed atop each of the third plurality of fins 136. Each of the angled plasma etch cycles 164 may be performed after a rotation of the substrate 115. The third etch process may recess the substrate 115 to the etch stop layer 158. As shown, the third etch process forms the third plurality of fins 165 having a third angle σ relative to the base surface 160 of the etch stop layer 158. In some embodiments, the third angle σ is an acute angle. As demonstrated in FIGS. 8A-8C, the first angle θ, the second angle ρ, and the third angle σ are different from one another. In other embodiments, the first angle θ, the second angle ρ, and the third angle σ are the same or approximately the same.

Figure 9:
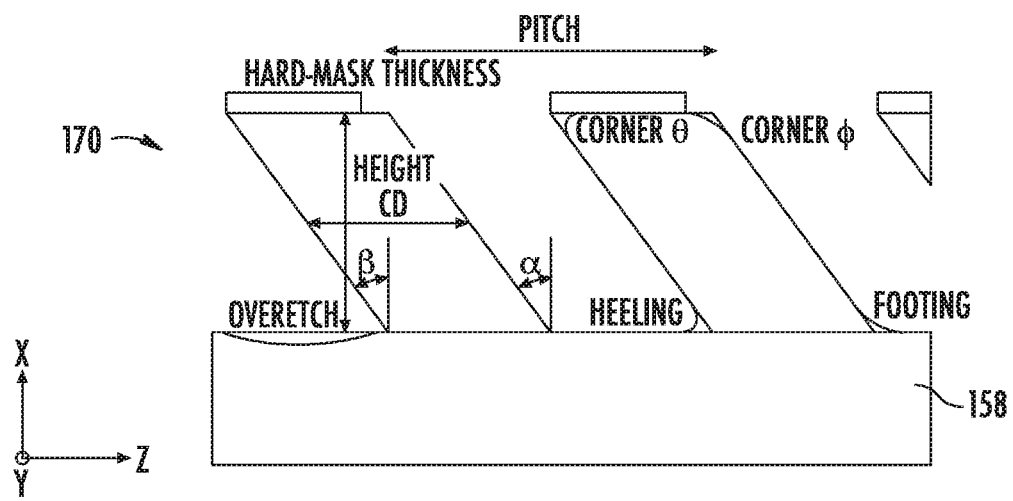
FIG. 9 depicts a set of fins of a slanted grating according to embodiments of the present disclosure.

Turning now to FIG. 9, an example set of fins 170 formed by the etch processes of the embodiments herein will be described in greater detail. As shown, the fins 170 may represent each of the first plurality of fins 134 of the first angled grating 130, the second plurality of fins 135 of the second angled grating 131, and/or the third plurality of fins 136 of the third angled grating 132. Furthermore, the fins 170 may be formed by any of the above described etch processes to manufacture the fins 170 with unique locations, shapes, three dimensional orientations, etc. In some examples, the etch processes are capable of controlling or modifying any of the following grating parameters of the set of fins 170: pitch, hardmask thickness, fin height, fin thickness (CD), corner radius θ and φ, over-etch into the etch stop layer 158, heeling, and footing.

Figure 10:
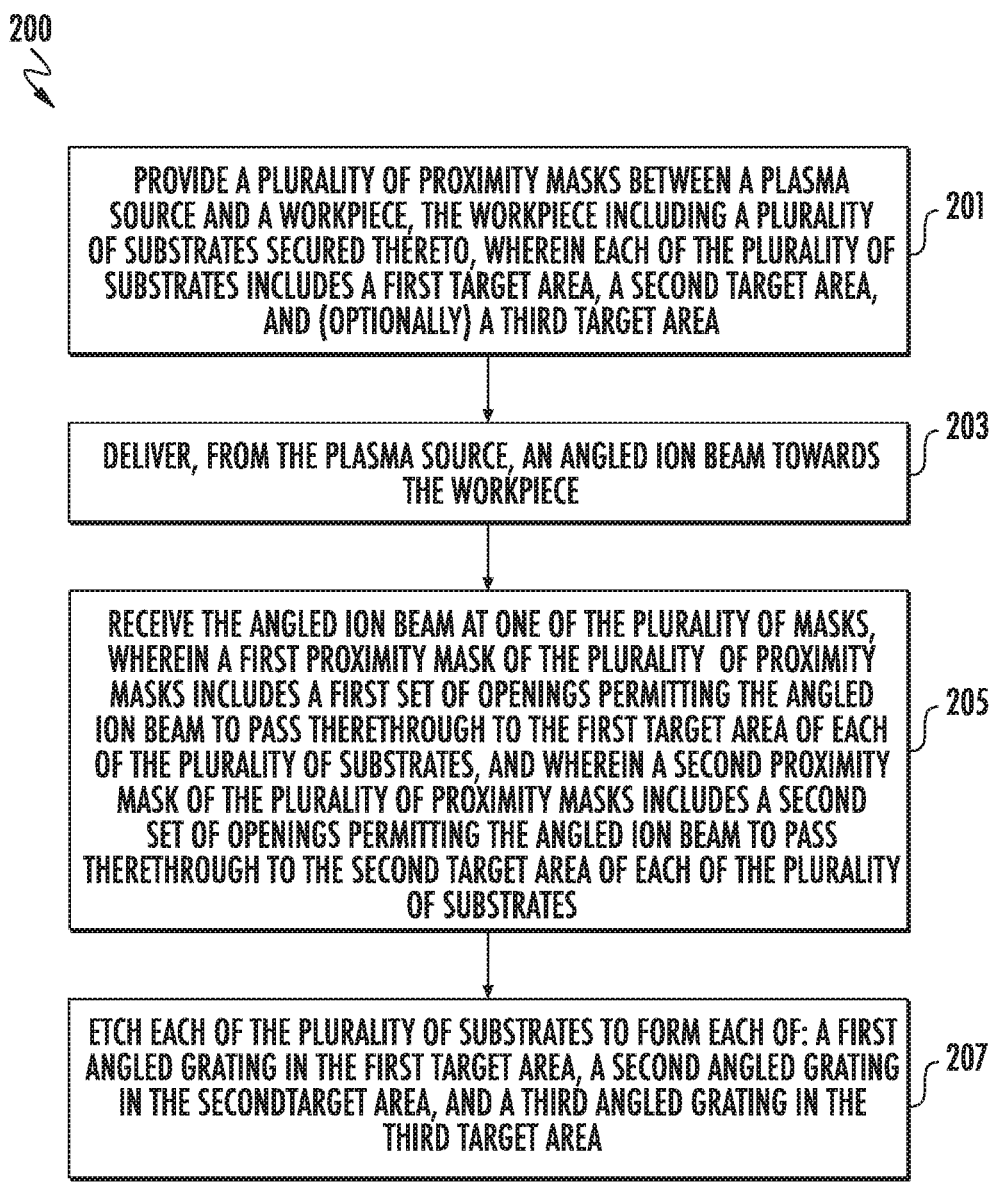
FIG. 10 depicts a method for forming a diffracted optical element having varied gratings in accordance with embodiments of the disclosure.

Turning now to FIG. 10, a method 200 for forming a diffracted optical element having varied gratings according to embodiments of the present disclosure will be described in greater detail. Specifically, at block 201, the method 200 may include providing a plurality of proximity masks between a plasma source and a workpiece, the workpiece including a plurality of substrates secured thereto, wherein each of the plurality of substrates includes a first target area and a second target area. In some embodiments, each of the plurality of substrates further includes a third target area.

At block 203, the method 200 may further include delivering, from the plasma source, an angled ion beam towards the workpiece. In some embodiments, the angled ion beam is a ribbon beam and reactive radicals for performing an angled ion etch process. In some embodiments, a beam width of the beam may be greater than the diameter of the workpiece. For example, the width of the beam may be a few cm wider than the workpiece so the workpiece is processed in one pass.

At block 205, the method 200 may include receiving the angled ion beam at one of the plurality of masks, wherein a first proximity mask of the plurality of proximity masks includes a first set of openings permitting the angled ion beam to pass therethrough to the first target area of each of the plurality of substrates. A second proximity mask of the plurality of proximity masks may include a second set of openings permitting the angled ion beam to pass therethrough to the second target area of each of the plurality of substrates. In some embodiments, the angled ion beam is received at just one proximity mask of the plurality of proximity masks at a time.

At block 207, the method 200 may further include processing (e.g., etching) each of the plurality of substrates to form each of: a first angled grating in the first target area, a second angled grating in the second target area, and a third angled grating in the third target area. In some embodiments, at block 207, the method 200 may further include performing a first etch process using the first proximity mask to form the first angled grating, performing a second etch process using the second proximity mask to form the second angled grating, and performing a third etch process using the third proximity mask to form the third angled grating. In some embodiments, the first etch process includes rotating the first proximity mask and the workpiece relative to one another. The second etch process may include rotating the second proximity mask and the workpiece relative to one another, and the third etch process may include rotating the third proximity mask and the workpiece relative to one another. In some embodiments, the first etch process, the second etch process, and the third etch process are performed consecutively while the workpiece remains fixed to a workpiece holder. In some embodiments, the first, second, and third etch processes are capable of controlling or modifying any of the following grating parameters of the first, second, and/or third angled gratings: pitch, hardmask thickness, fin height, fin thickness (CD), corner radius, over-etch into the etch stop layer, heeling, and footing.

In some embodiments, the first angled grating includes a first plurality of fins formed at a first angle relative to a base surface of each of the plurality of substrates, and the second angled grating includes a second plurality of fins formed at a second angle relative to the base surface of each of the plurality of substrates. The third angled grating may include a third plurality of fins formed at a third angle relative to the base surface of each of the plurality of substrates. In some embodiments, the first angle, the second angle, and the third angle are different from one another. In some embodiments, the first angle, the second angle, and the third angle are each acute.

In sum, various embodiments described herein provide approaches for forming various optically efficient grating shapes such as slanted gratings for light coupling (e.g., extraction or input) from a backlit substrate. Manufacturing may be accomplished by direct application of the angled ions on the substrate, or on a mask used to transfer the pattern to the substrate of interest. A first technical advantage of the present embodiments includes the use of multiple proximity masks to eliminate the need for lithography masking of various areas of the substrate, thus resulting in more efficient manufacturing. A second technical advantage of the present disclosure includes providing an angled etched with various angles, depths, and locations without removing the workpiece from the tool, thus resulting in more efficient manufacturing.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
    providing a plasma source and a plurality of substrates, each of the plurality of substrates including a first target area and a second target area; and
    positioning a plurality of proximity masks between the plasma source and the plurality of substrates, wherein a first proximity mask of the plurality of proximity masks includes a first set of openings permitting an angled ion beam to pass therethrough to the first target area of each of the plurality of substrates, and wherein a second proximity mask of the plurality of proximity masks includes a second set of openings permitting the angled ion beam to pass therethrough to the second target area of each of the plurality of substrates.

2. The method of claim 1, further comprising:
delivering, from the plasma source, the angled ion beam towards the plurality of substrates; and
receiving the angled ion beam at the first proximity mask or the second proximity mask.

3. The method of claim 1, wherein a third proximity mask of the plurality of proximity masks includes a third set of openings permitting the angled ion beam to pass therethrough to a third target area of each of the plurality of substrates.

4. The method of claim 3, further comprising etching each of the plurality of substrates to form each of: a first angled grating in the first target area, a second angled grating in the second target area, and a third angled grating in the third target area.

5. The method of claim 4, further comprising performing a first process using the first proximity mask to form the first angled grating, performing a second process using the second proximity mask to form the second angled grating, and performing a third process using the third proximity mask to form the third angled grating.

6. The method of claim 5, wherein the first process includes rotating the first proximity mask and the plurality of substrates relative to each another, wherein the second process includes rotating the second proximity mask and the plurality of substrates relative to each another, and wherein the third process includes rotating the third proximity mask and the plurality of substrates relative to one another.

7. The method of claim 5, wherein the first process, the second process, and the third
process are performed sequentially without removing the plurality of substrates from a workpiece holder, and wherein the first process, the second process, and the third process are capable of controlling any of the following grating parameters of the first angled grating, the second angled grating, and the third angled grating: pitch, hardmask thickness, fin height, fin thickness (CD), corner radius, over-etch into an etch stop layer, heeling, and footing.

8. The method of claim 5, wherein the first angled grating includes a first plurality of fins formed at a first angle relative to a base surface of each of the plurality of substrates, wherein the second angled grating includes a second plurality of fins formed at a second angle relative to the base surface of each of the plurality of substrates, wherein the third angled grating includes a third plurality of fins formed at a third angle relative to the base surface of each of the plurality of substrates, and wherein the first angle, the second angle, and the third angle are different from one another.

9. The method of claim 8, wherein the angled ion beam is received at just one proximity mask of the plurality of proximity masks at a time.

10. A method for forming an optical element, the method comprising:
providing a plasma source and a plurality of substrates, each of the plurality of substrates including a first target area and a second target area; and
positioning a plurality of proximity masks between the plasma source and the plurality of substrates, wherein a first proximity mask of the plurality of proximity masks includes a first set of openings permitting an angled ion beam to partially pass therethrough to the first target area of each of the plurality of substrates, and wherein a second proximity mask of the plurality of proximity masks includes a second set of openings permitting the angled ion beam to partially pass therethrough to the second target area of each of the plurality of substrates.

11. The method of claim 10, wherein a third proximity mask of the plurality of proximity masks includes a third set of openings permitting the angled ion beam to partially pass therethrough to a third target area of each of the plurality of substrates.

12. The method of claim 11, further comprising etching each of the plurality of substrates to form each of: a first angled grating in the first target area, a second angled grating in the second target area, and a third angled grating in the third target area.

13. The method of claim 12, further comprising performing a first process using the first proximity mask to form the first angled grating, performing a second process using the second proximity mask to form the second angled grating, and performing a third process using the third proximity mask to form the third angled grating.

14. The method of claim 13, wherein the first process, the second process, and the third process are performed sequentially without removing the workpiece from a workpiece holder, and wherein the first process, the second process, and the third process are capable of controlling any of the following grating parameters of the first angled grating, the second angled grating, and the third angled grating: pitch, hardmask thickness, fin height, fin thickness (CD), corner radius, over-etch into an etch stop layer, heeling, and footing.

15. The method of claim 12, wherein the first angled grating includes a first plurality of fins formed at a first angle relative to a base surface of each of the plurality of substrates, wherein the second angled grating includes a second plurality of fins formed at a second angle relative to the base surface of each of the plurality of substrates, and wherein the third angled grating includes a third plurality of fins formed at a third angle relative to the base surface of each of the plurality of substrates.

16. The method of claim 14, wherein the first angle, the second angle, and the third angle are different from one another.

17. A method, comprising:
providing a plasma source and a workpiece, the workpiece including a plurality of substrates secured thereto;
positioning a first proximity between the plasma source and the workpiece, the first proximity mask including a first set of openings operable to permit an angled ion beam to pass therethrough to just a first target area of each of the plurality of substrates;
forming a first set of angled gratings in the first target area by etching the first target area using the angled ion beam;
positioning a second proximity mask between the plasma source and the workpiece, the second proximity mask including a second set of openings operable to permit the angled ion beam to pass therethrough to just a second target area of each of the plurality of substrates; and
forming a second set of angled gratings in the second target area by etching the second target area using the angled ion beam.

18. The method of claim 17, further comprising removing the first proximity mask from between the plasma source and the workpiece prior to positioning the second proximity mask between the plasma source and the workpiece.

19. The method of claim 17, further comprising:
positioning a third proximity mask between the plasma source and the workpiece, the third proximity mask including a third set of openings operable to permit the angled ion beam to pass therethrough to just a third target area of each of the plurality of substrates; and
forming a third set of angled gratings in the second target area by etching the third target area using the angled ion beam.

20. The method of claim 17, further comprising forming the first set of angled gratings and the second set of angled gratings sequentially without removing the plurality of substrates from a workpiece holder.

* * * * *